(12) United States Patent
Lee

(10) Patent No.: US 6,232,155 B1
(45) Date of Patent: May 15, 2001

(54) METHODS OF FABRICATING SEMICONDUCTOR-ON-INSULATOR DEVICES INCLUDING ALTERNATING THIN AND THICK FILM SEMICONDUCTOR REGIONS ON AN INSULATING LAYER

(75) Inventor: Duck-hyung Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/454,340

(22) Filed: Dec. 3, 1999

Related U.S. Application Data

(62) Division of application No. 08/861,957, filed on May 22, 1997, now Pat. No. 6,020,615.

(30) Foreign Application Priority Data

Jun. 7, 1996 (KR) .................................................. 96-20356

(51) Int. Cl.[7] .................................................. H01L 21/00
(52) U.S. Cl. ............................. 438/149; 505/330; 357/26
(58) Field of Search ........................... 438/149; 505/330; 437/62, 86, 974; 357/26

(56) References Cited

U.S. PATENT DOCUMENTS

| | | | |
|---|---|---|---|
| 4,860,071 | * 8/1989 | Sunami et al. | 357/23.6 |
| 4,992,846 | 2/1991 | Sakakibara et al. | 357/59 |
| 5,466,628 | * 11/1995 | Lee et al. | 437/60 |
| 5,650,354 | * 7/1997 | Himi et al. | 437/63 |
| 5,798,545 | * 8/1998 | Iwasa et al. | 257/301 |

OTHER PUBLICATIONS

Iwamatsu et al., *High–Speed 0.5 μm SOI 1/8 Frequency Divider With Body–Fixed Structure for Wide Range of Applications*, Abstracts of the 1995 International Conference on Solid State Devices and Materials, Osaka, 1995, pp. 575,577.

* cited by examiner

*Primary Examiner*—Matthew Smith
*Assistant Examiner*—Renzo N. Rocchegiani
(74) *Attorney, Agent, or Firm*—Myers Bigel Sibley & Sajovec

(57) ABSTRACT

A semiconductor-on-insulator (SOI) device is fabricated by forming spaced apart trenches in a first face of a semiconductor substrate. An insulating layer is formed on the first face of the semiconductor substrate, including on the trenches. A second substrate is bonded to the insulating layer, opposite the semiconductor substrate. The semiconductor substrate is thinned at a second face thereof which is opposite the first face, until a semiconductor film remains on the insulating layer, having alternating thin and thick film semiconductor regions on the insulating layer. Source/drains are formed in the thin film semiconductor regions. Insulated gates are formed on the thick film semiconductor regions, such that a respective insulated gate is located between adjacent source/drains. SOI devices which can suppress floating body effects and yet provide dense integration may thereby be formed.

7 Claims, 10 Drawing Sheets

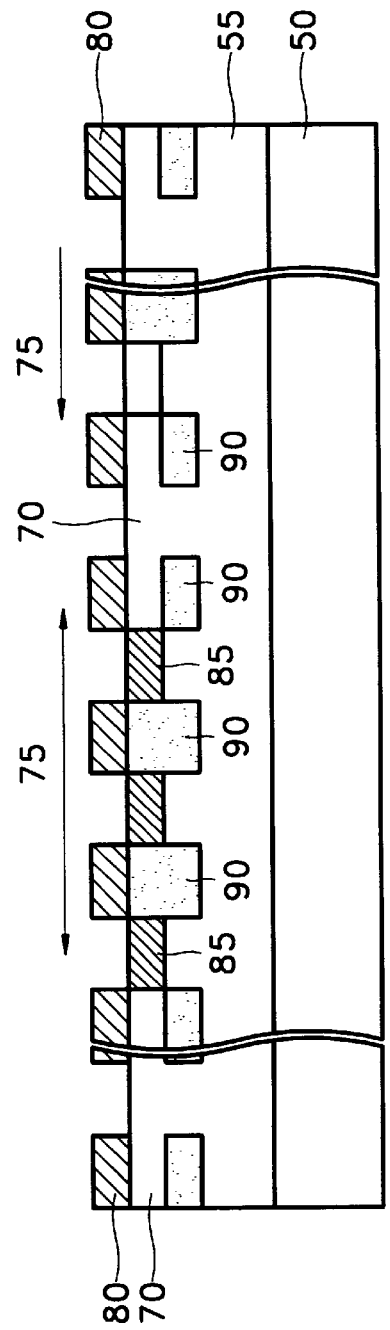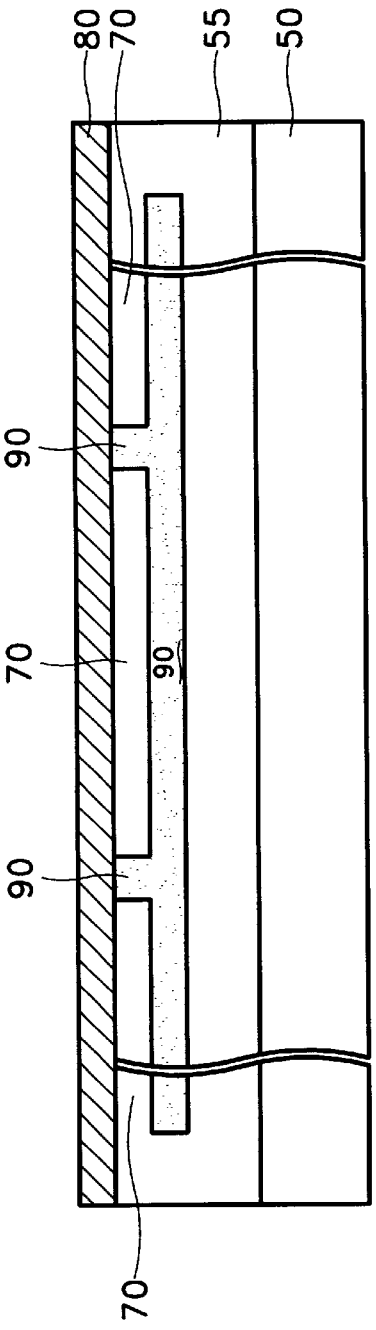

METHODS OF FABRICATING SEMICONDUCTOR-ON-INSULATOR DEVICES INCLUDING ALTERNATING THIN AND THICK FILM SEMICONDUCTOR REGIONS ON AN INSULATING LAYER

This application is a divisional of application Ser. No. 08/861,957 filed on May 22, 1997, now U.S. Pat. No. 6,020,615, issued Feb. 1, 2000, to Lee, Duck-Hyung.

FIELD OF THE INVENTION

This invention relates to semiconductor devices and manufacturing methods, and more particularly to semiconductor-on-insulator devices and fabrication methods.

BACKGROUND OF THE INVENTION

Semiconductor-on-insulator (SOI) devices are widely used in microelectronics. In general, SOI devices include active devices such as transistors in a thin semiconductor layer which is on an insulator. In contrast, bulk semiconductor devices include active devices such as transistors in a bulk semiconductor region. SOI devices often use a layer of monocrystalline silicon as a semiconductor material. These devices are often referred to as silicon-on-insulator devices.

Transistors which are formed using SOI technology, hereinafter referred to as SOI transistors, can provide improved isolation and can generally withstand higher supply voltages than bulk semiconductor devices. Moreover, thin film SOI transistors generally have small subthreshold swings and may be used with operating voltages of two volts or less without degrading the operation thereof.

Unfortunately, SOI transistors may be susceptible to bipolar-induced breakdown due to the floating body thereon.

FIG. 1 is a cross-sectional view which illustrates a conventional SOI transistor, and particularly SOI CMOS transistors. As shown in FIG. 1, an insulating layer 3 is located on a semiconductor substrate 1. A transistor, comprising a gate 7, a source 8 and a drain 9 is formed in a thin semiconductor film on the insulating layer 3. Also included is a body layer 5 where the channels of the transistor are located, between the source 8 and drain 9.

As shown in FIG. 1, unlike conventional bulk transistors, the SOI transistor generally does not include a contact which can apply a voltage to the body layer 5. Thus, the body layer 5 is floating. Unfortunately, the floating body layer 5 may reduce the breakdown voltage of the transistor due to the formation of a parasitic bipolar transistor.

For example, for an N-type transistor, if electrons reach a depletion region of the drain 9 from the source 8 where the electric field of the drain is increased by the increased voltage of the drain 9, impact ionization may occur due to the strong forces caused by the increased electric field. Electron hole pairs may be generated. Electrons are extracted through a drain electrode (not shown in FIG. 1) and holes move toward the body layer 5 and are stored thereat.

Accordingly, the potential of the body layer 5 may increase so that the junction between the body layer 5 and the source is forward-biased. The electrons which are injected from the source 8 to the body layer 5 can create a parasitic bipolar transistor in which the source 8, the body layer 5 and the drain 9 function as an emitter, a base and a collector, respectively.

When the parasitic bipolar transistor is formed, a snap-back phenomena may be produced such that the drain current abruptly increases when reduced voltage is applied to the source and drain of the SOI transistor. Accordingly, the breakdown voltage of the SOI transistor may be reduced.

It will be understood that the floating body effect described above may be reduced by forming contacts to the body layer 5. However, since each body layer 5 is isolated from the remaining transistors in a conventional SOI device, it may be difficult to form body layer contacts. Moreover, for highly integrated devices containing many transistors, the body layer contact for each contact may reduce the integration density of the device.

SUMMARY OF THE INVENTION

It is therefore an object of the invention to provide SOI devices which can reduce or suppress the floating body effect, and methods of fabricating the same.

It is another object of the present invention to provide SOI devices which can apply voltages to the body region of every transistor, and methods of fabricating the same.

It is still another object of the present invention to provide highly integrated SOI devices and methods of fabricating the same.

These and other objects are provided, according to the present invention, by SOI devices which include a substrate, an insulating layer on the substrate and a semiconductor film on the insulating layer, wherein the semiconductor film comprises alternating thin and thick film semiconductor regions on the insulating layer. The thin film semiconductor regions include a plurality of source/drains therein. The thick film semiconductor regions form a plurality of body layers and include an insulated gate thereon, a respective insulated gate being located between adjacent source/drains. The thick film semiconductor regions are electrically interconnected in the semiconductor film. Accordingly, each body region may be connected to a voltage, to thereby reduce the floating body effect, without requiring a decrease in integration density.

Preferably, the thin and thick film semiconductor regions comprise alternating thin and thick film semiconductor stripes. The thick film semiconductor stripes extend around the ends of the thin film semiconductor stripes, to thereby form a continuous thick film region.

According to another aspect, at least one isolation film is included, surrounding the alternating thin and thick film semiconductor regions. The at least one isolation film is thinner than the thick film semiconductor regions and is preferably of the same thickness as the thin film semiconductor regions. The isolation film is preferably a trench isolation film.

According to another aspect of the present invention, a plurality of capacitors are formed in the insulating layer. A respective capacitor is electrically connected to a respective source/drain.

SOI devices are fabricated, according to method aspects of the present invention, by forming a plurality of spaced apart trenches in a first face of a semiconductor substrate. An insulating layer is formed on the first face of the semiconductor substrate, including on the trenches. A second substrate is bonded to the insulating layer, opposite the semiconductor substrate. The semiconductor substrate is thinned at a second face thereof, which is opposite the first face, until a semiconductor film remains on the insulating layer, having alternating thin and thick film semiconductor regions on the insulating layer. The thinning step may be provided by etching the semiconductor substrate at the second face thereof.

After the semiconductor substrate is thinned, a plurality of source/drains are formed in the thin film semiconductor regions. A plurality of insulated gates are formed on thick film semiconductor regions to define body layers, such that a respective insulated gate is located between adjacent source/drains.

In a preferred embodiment, at least one isolation trench is formed in the first face of the semiconductor substrate, surrounding the plurality of spaced apart trenches, prior to forming the insulating layer on the first face. The isolation trenches are deeper than the plurality of spaced apart trenches. Then, the thinning step comprises the step of thinning the semiconductor substrate at a second face thereof, which is opposite the first face, until the isolation trenches are exposed.

An interlayer insulating film may be formed on the thin and thick film semiconductor regions, after the step of forming the plurality of source/drains. The interlayer insulating film may include an electrical contact therein which electrically contacts at least one of the thick film semiconductor regions, and preferably contacts the outermost one of the thick film semiconductor regions.

Buried capacitors may also be formed in the SOI devices. In particular, after the spaced apart trenches are formed, an interlayer insulating film is formed on the first face of the semiconductor substrate, including on the trenches. The interlayer insulating film includes apertures therein which expose portions of the trenches. Storage electrodes are formed on the interlayer insulating film, electrically contacting the trenches through the apertures. A dielectric film is formed on the storage electrode and plate electrodes are formed on the dielectric film, opposite the storage electrodes, to thereby form a buried capacitor.

Since the thick SOI film which forms the body layer, and the SOI film which is formed under the isolation film are connected to each other, a voltage can be applied to the thick SOI film of every cell in a cell block by forming a contact to the edge of the cell block. Since the body can be fixed by a single contact without requiring a contact to be formed in each channel, the body floating effect can be reduced or suppressed and high integration may be provided.

BRIEF DESCRIPTION OF THE DRAWINGS

FIGS. 3A and 3B are cross-sectional views taken along lines 3A—3A' and 3B—3B' of FIG. 2;

DETAILED DESCRIPTION OF PREFERRED EMBODIMENTS

Figure 1:
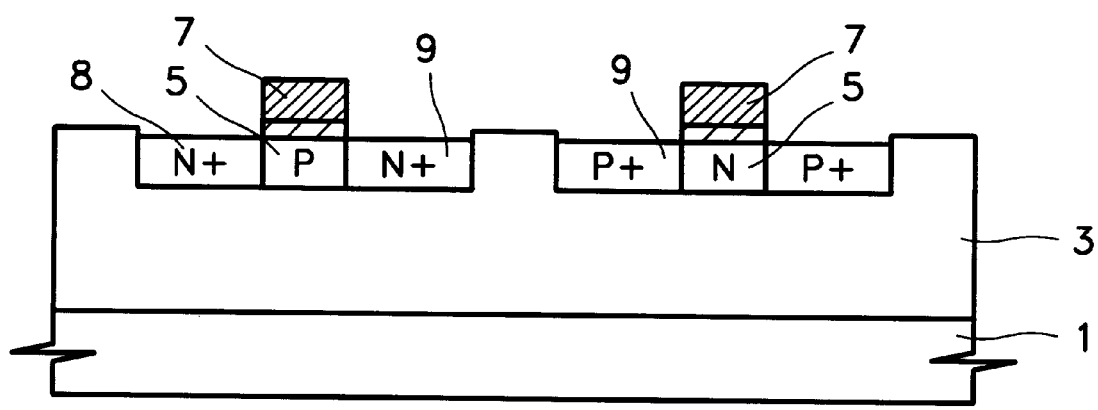
FIG. 1 is a cross-sectional view of a conventional SOI device.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present. Moreover, each embodiment described and illustrated herein includes its complementary conductivity type embodiment as well.

Figure 2:
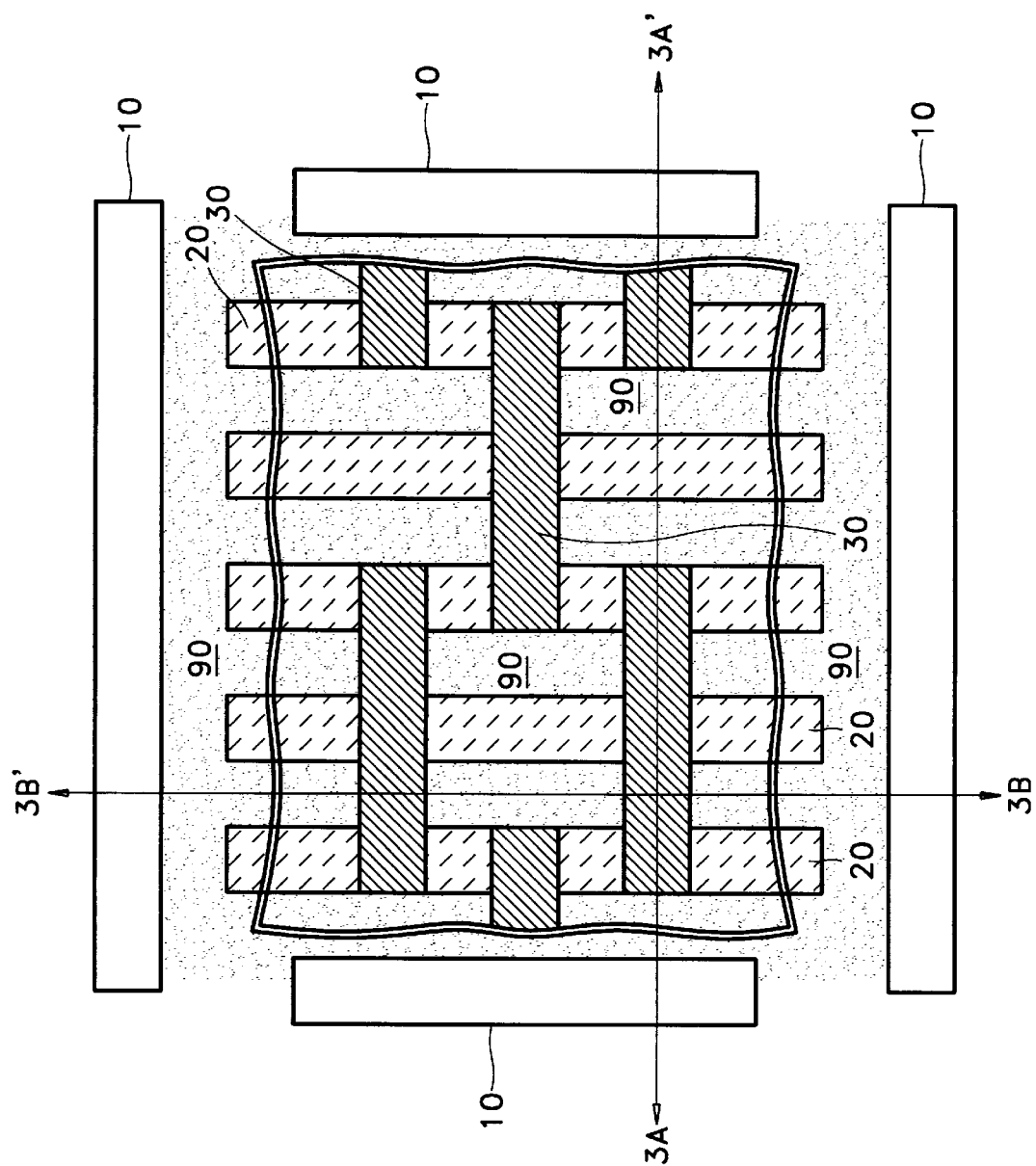
FIG. 2 is a plan view partially illustrating mask patterns used in fabricating SOI devices according to the present invention.

Referring to FIG. 2, reference numeral 10 denotes a first mask pattern which defines a cell block and reference numeral 20 denotes a second mask pattern which is formed in the form of a plurality of lines within the cell block and which defines a body. Reference numeral 30 denotes a third mask pattern intersecting the second mask pattern 20 and which defines an active region.

Source/drains are formed where the third mask pattern 30 intersects the second mask pattern 20. Also, although not shown, a mask pattern for forming gates is positioned between neighboring second mask patterns 20.

A body semiconductor layer 90 is formed within a cell block, excluding the area for the first mask pattern 10 and the second mask pattern 20. As shown, the body layer 90 is in the form of lines between neighboring second mask patterns 20, and the respective lines are connected to each other at the edges of the cell block. Therefore, the body layers 90 of the respective transistors are connected to each other within the cell block defined by the first mask pattern 10.

FIGS. 3A and 3B are cross-sectional views illustrating SOI devices formed using the layout of FIG. 2, taken along lines 3A—3A' and 3B—3B' of FIG. 2. Referring to FIGS. 3A and 3B, an insulating layer 55 is formed on a second substrate 50 which may be a semiconductor substrate, and a thin SOI film and a thick SOI film are alternately formed thereon to form an active region 75 having a predetermined size. The thin SOI film is formed where the second mask pattern 20 and the third mask pattern 30 shown in FIG. 2 intersect, and corresponds to a source/drain 85. The thick SOI film is formed at a portion excluding the second mask pattern 20, and corresponds to a body layer 90 of the SOI device. A gate 80 is formed on the body layer 90.

Also, a trench-type isolation film 70 between the active regions 75 is formed by the third mask pattern (30 of FIG. 2) and is thinner than the thick body layer 90. Active regions 75 are preferably the same thickness as the thin source/drain 85. As shown in FIG. 3A, parts of the body layer 90 remain under the isolation film 70. As shown in FIG. 3B, the body layer 90 within the active region 75 and under the isolation film 70 are connected to each other to form the interconnected body layer 90.

The body layers 90 of the respective transistors connected in a line, as shown in FIG. 2, are connected at the edges of the cell block. In other words, the body layer 90 of the respective transistors are electrically connected throughout the cell block. Although not shown, a voltage can be applied throughout the cell block through a contact. Therefore, since carriers stored in the body, e.g., holes, can be extracted through one contact, the floating body effect can be reduced and high integration can be provided.

Figure 4A:
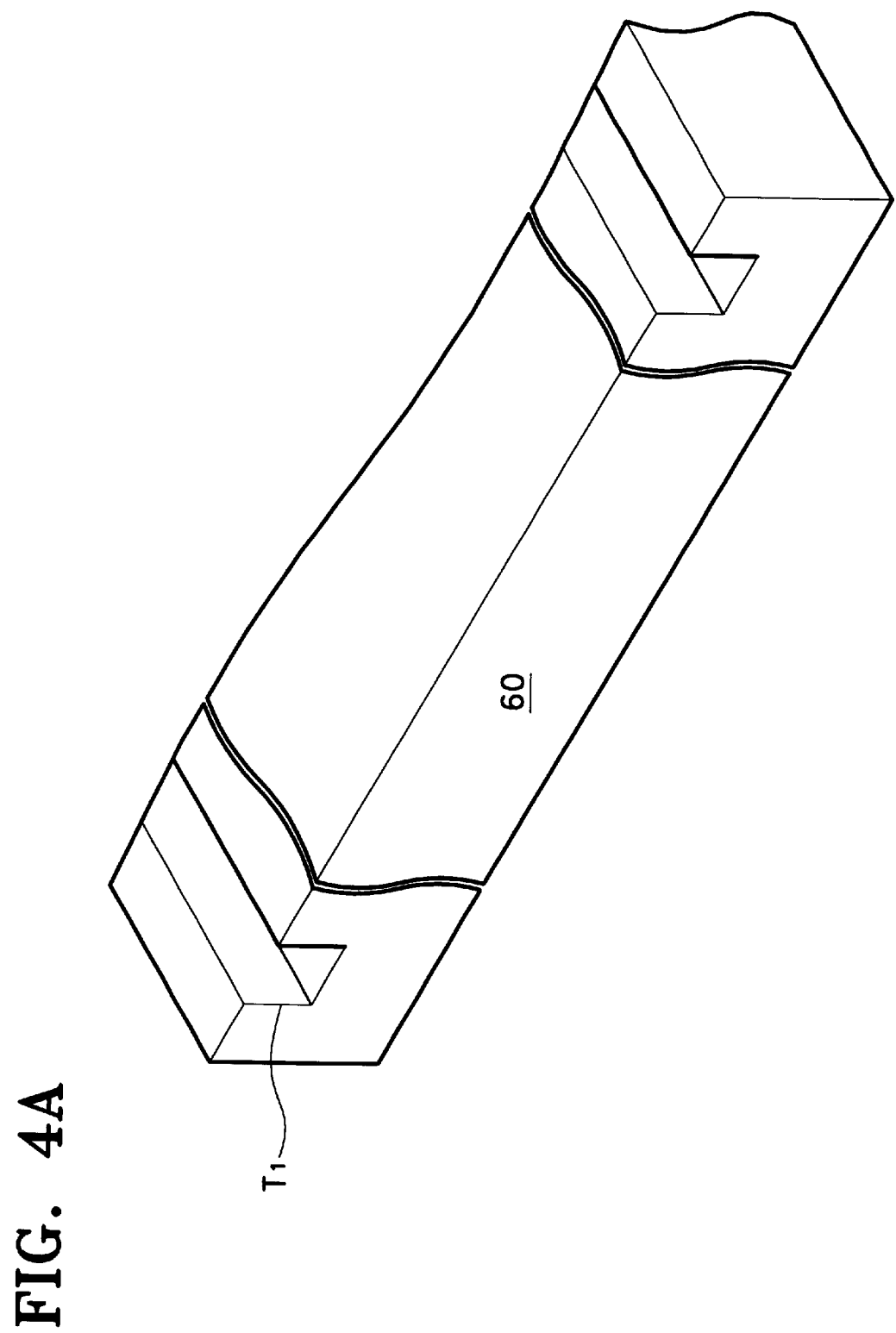
FIGS. 4A through 4E are cross-sectional views for explaining fabricating methods of SOI devices (in a direction 3A—3A' of FIG. 2) according to a first embodiment of the present invention.

FIGS. 4A through 4E are cross-sectional views for explaining fabricating methods of SOI devices (in the direction 3A—3A' of FIG. 2) according to a first embodiment of the present invention. FIG. 4A illustrates a step of forming a first trench T1 in a first semiconductor substrate 60 such as a silicon substrate. The first semiconductor substrate 60 is etched using a conventional lithography process to form the first trench T1 defining a cell block at the edge of a portion where a cell is to be formed.

The bottom of the first trench T1 can serve as an etch stop when thinning (e.g. etching or polishing) the first semiconductor substrate 60. As such, first trench T1 need not be formed when performing in-situ monitoring of the thickness of a wafer during the polishing process.

Figure 4B:
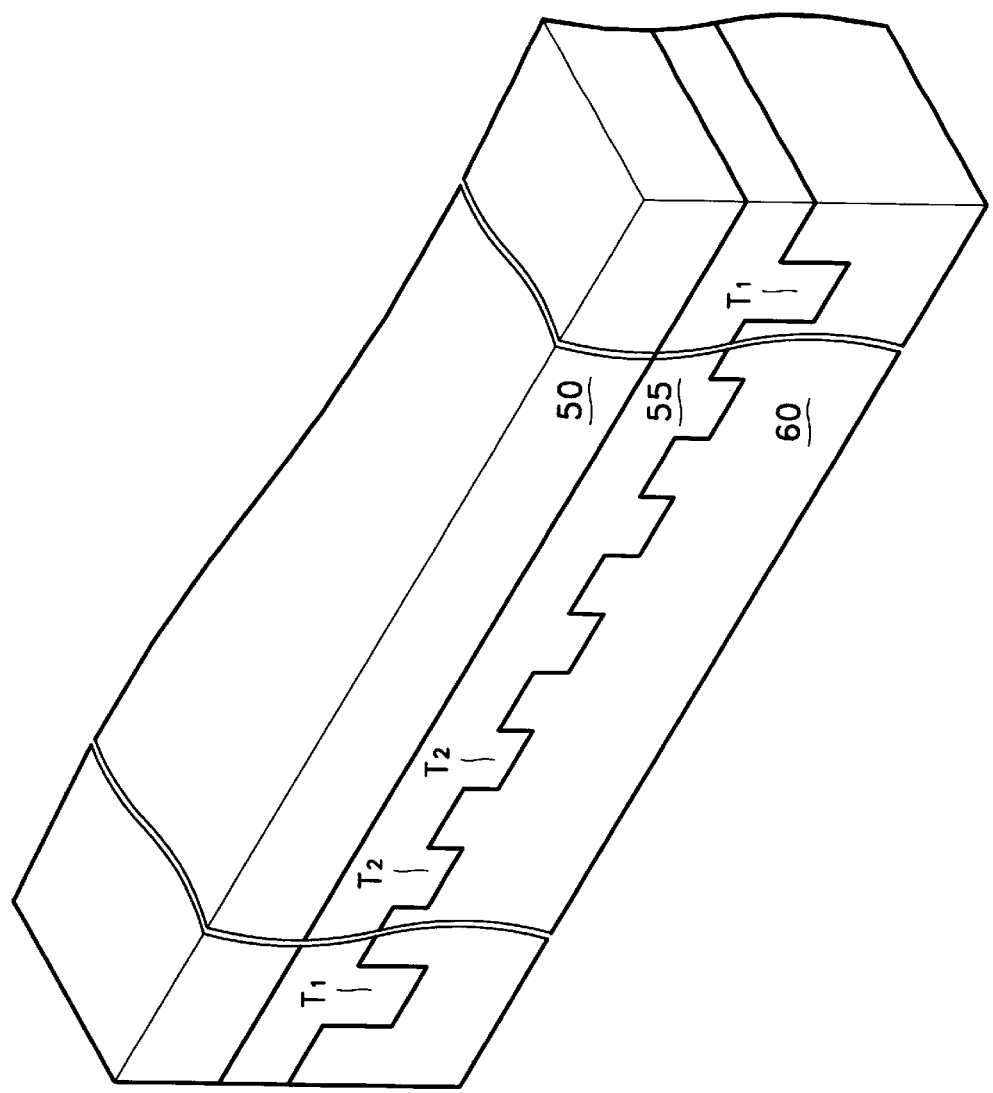

FIG. 4B illustrates a step of forming second spaced apart trenches T2 in a first face of the first semiconductor substrate 60. The second trenches T2 are formed in the form of a plurality of lines in the first semiconductor substrate 60. The depths of the second trenches T2 are smaller than that of the first trench T1 The depth difference between the first and second trenches T1 and T2 may determine the depth of the source/drain to be formed later, i.e., a junction depth.

An insulating layer 55 is then formed on the first face of the semiconductor substrate 60, for example by depositing an insulating material, e.g., an oxide, on the first face of the semiconductor substrate. Then, the surface of the insulating layer 55 is planarized by an etch-back or polishing process. Next, a second wafer 50 is bonded on the planarized insulating layer 55 by a conventional wafer bonding method. Wafer 50 need not be a semiconductor wafer.

Figure 4C:
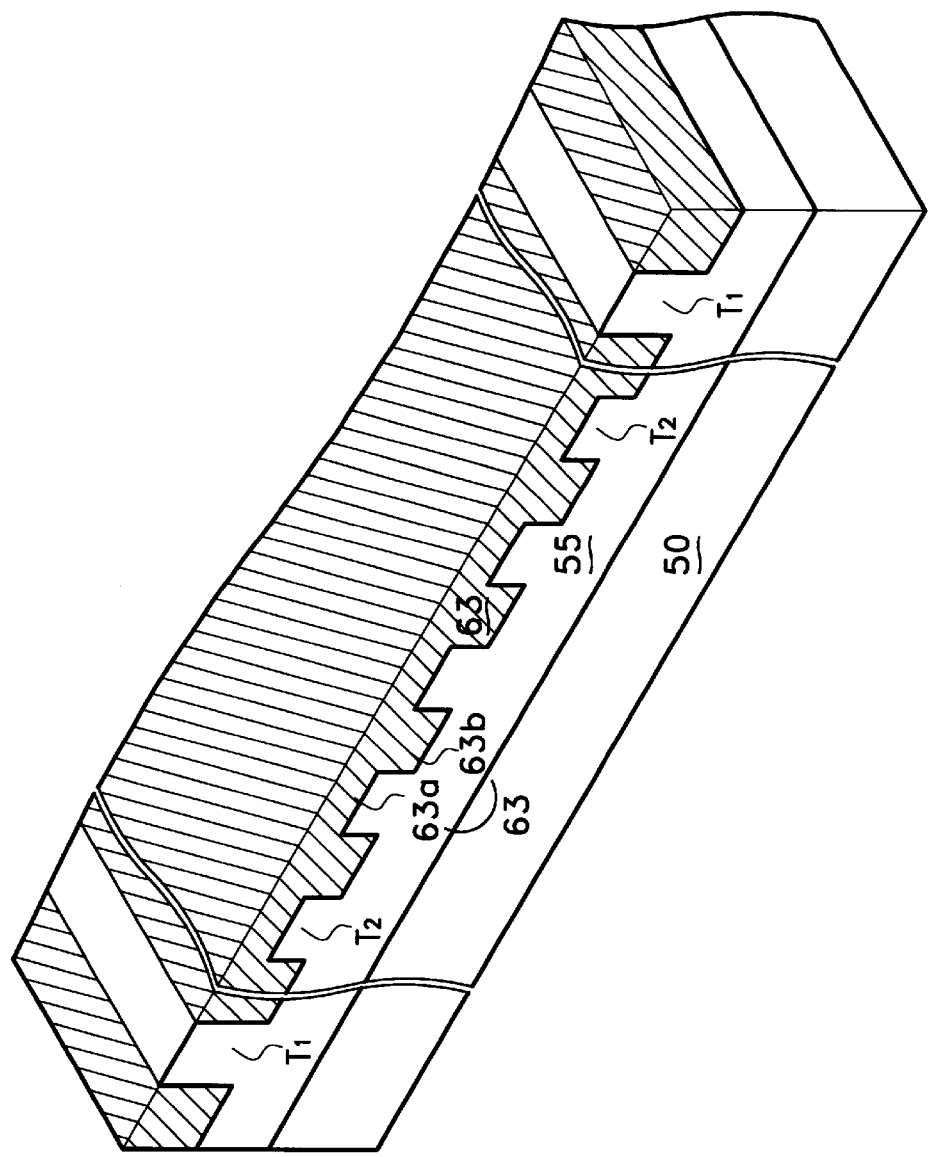

FIG. 4C illustrates a step of forming an SOI film 63. Subsequently, the second face of the first semiconductor substrate 60 which is opposite the first face, is thinned, e.g. by etching or polishing, to form the SOI film 63. The polishing process preferably is continued until the bottom of the first trench T1 is exposed. Therefore, the SOI film 63 is comprised of a thin film 63a and a thick film 63b.

Figure 4D:
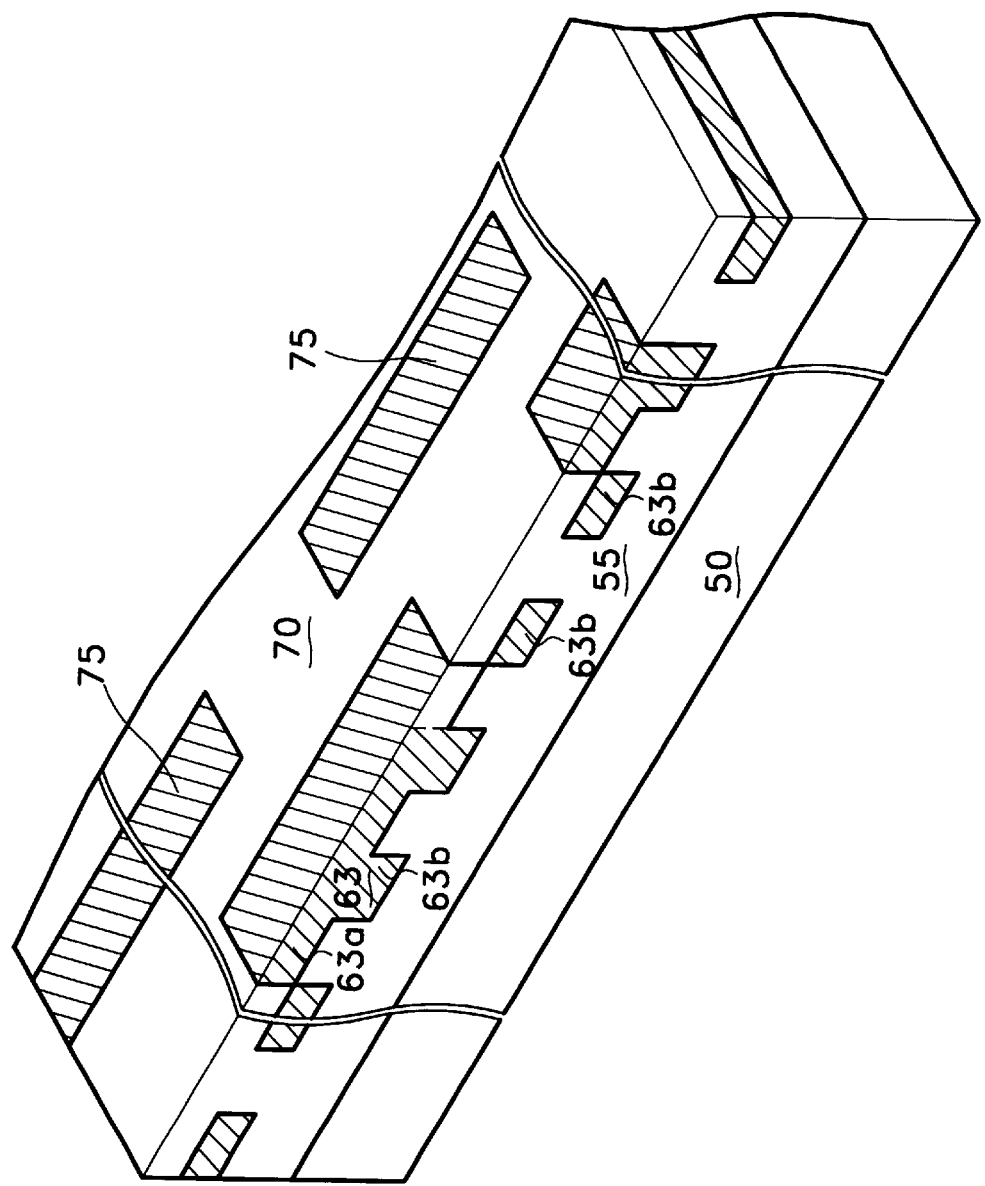

FIG. 4D illustrates a step of forming an isolation film 70. The isolation film 70 is formed by performing an isolation process on the structure having the SOI film 63 formed therein, for example a trench isolation process, to define an active region 75. In this case, the isolation film 70 can also be formed using a LOCal Oxidation of Silicon (LOCOS) process when the pattern of the active region to be formed is large.

In both cases, the isolation film 70 is thinner than the thick SOI film 63b, and is preferably the same thickness as the thin SOI film 63a. Therefore, parts of the thick SOI film 63b remain under the isolation film 70, and the thick SOI film 63b formed within the active region 75 and remaining under the isolation film 70 are connected to each other (see FIG. 3).

Figure 4E:
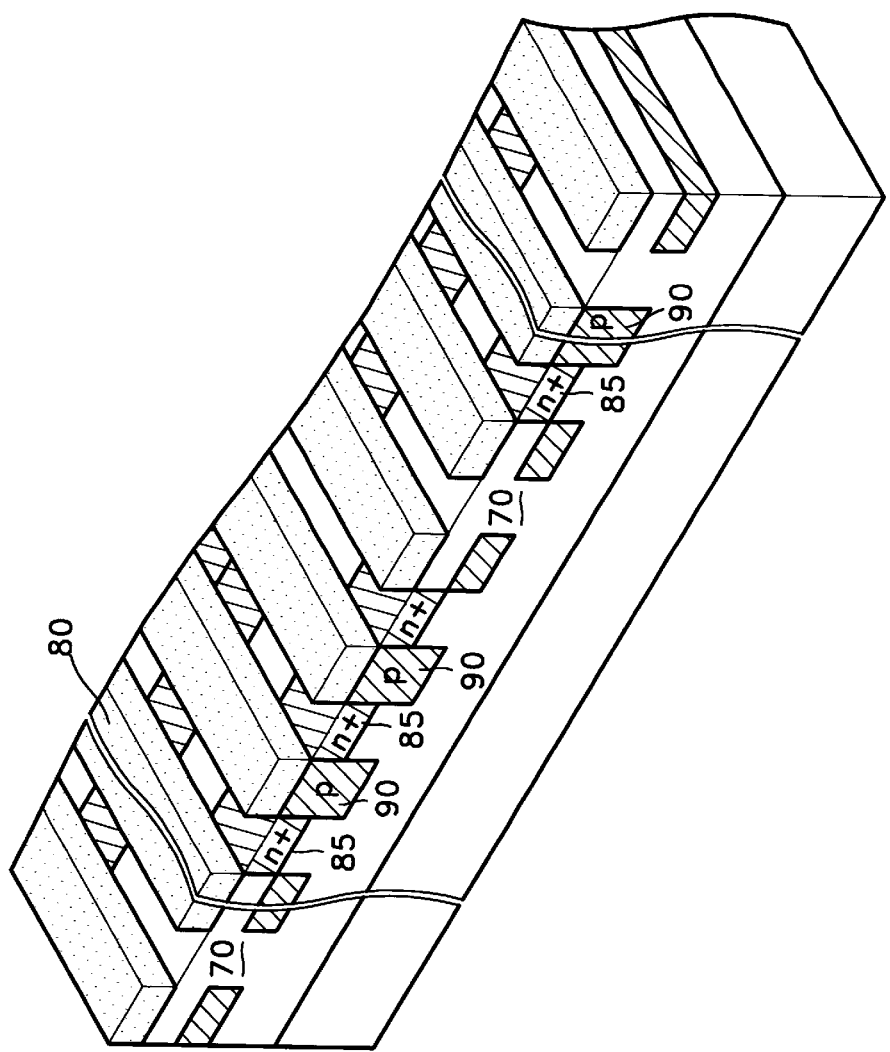

FIG. 4E illustrates a step of forming a gate electrode 80 and a source/drain 85. A gate oxide film (not shown) is formed on the substrate 55 having the isolation film 70 therein. A conductive material, e.g., polysilicon, is deposited thereon to be patterned by a lithography process, thereby forming the gate electrode 80 for the SOI device on the thick SOI film (63b of FIG. 4C). Impurities are implanted into the thin SOI film 63a using a conventional ion implantation process. Therefore, the source/drain 85 is formed in the thin SOI film 63a and the body layer 90 is formed in the thick SOI film 63b. For an N-channel SOI device, the source/drain 85 is doped $N^+$ type, and the body layer 90 is doped P type.

Subsequently, an interlayer insulation film (not shown) is formed on the structure. A body contact (not shown) exposing a predetermined portion of the body layer 90, e.g. the edge of the cell block, is formed by a conventional contact forming process. Then, a source/drain interconnection (not shown) and a body contact interconnection (not shown) are formed by an interconnection process, thereby completing the SOI device.

As described above, SOI devices according to the first embodiment of the present invention may be fabricated such that the body layer having a channel formed therein is formed of a thick film, the source/drain is formed of a thin film, and the isolation film is thinner than the body layer. Part of the body layer remains under the isolation film. Therefore, the body layer of the active region and under the isolation layer are connected to each other so that the body layers within the cell block are interconnected. A voltage thus can be applied to the body layers of all cells in the cell block through a contact formed at the edge of the cell block. Since the body layers can be fixed by one contact without requiring formation of a contact for each transistor in the cell block, the floating body effect can be reduced or suppressed and high integration can be obtained.

Figure 5A:
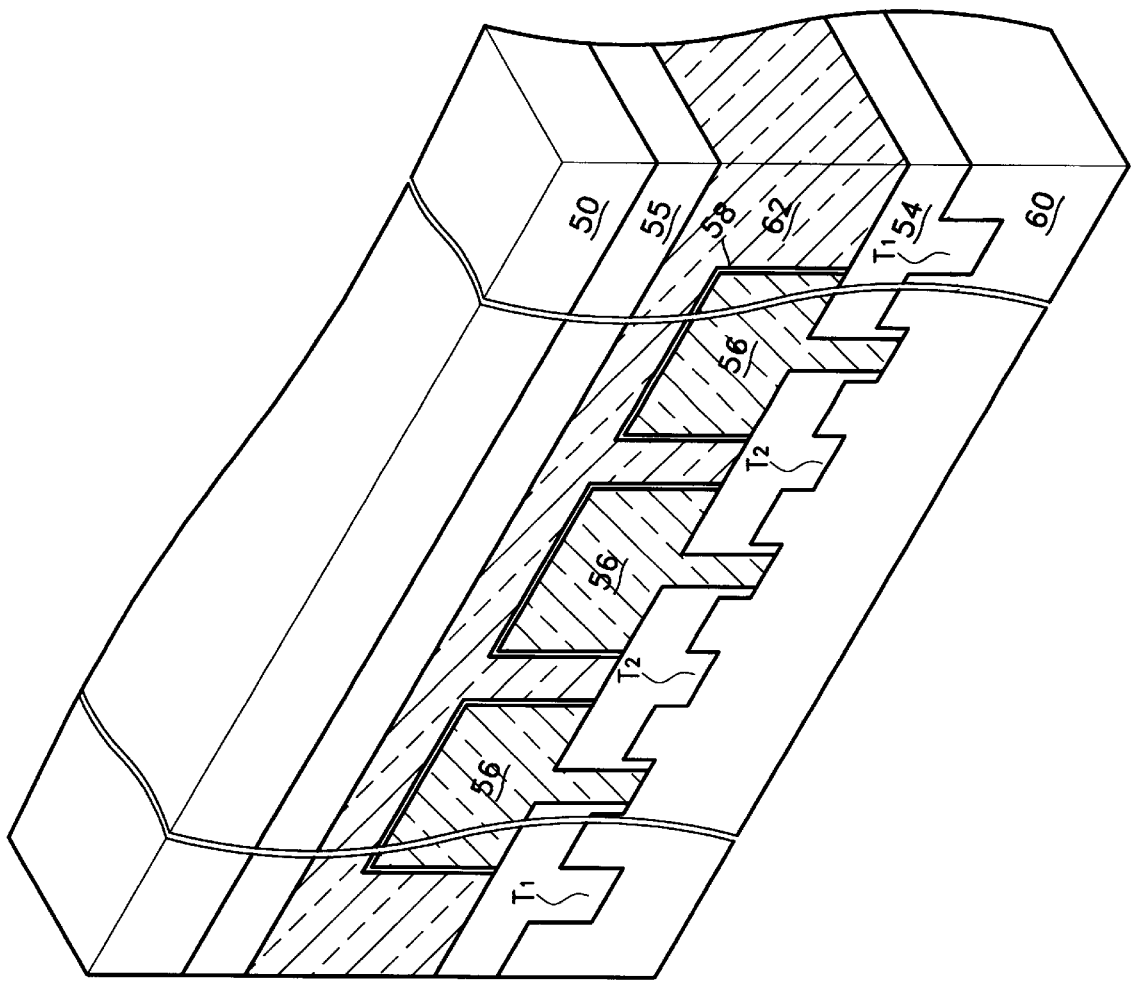
FIGS. 5A and 5B are cross-sectional views for explaining fabricating methods of SOI devices according to a second embodiment of the present invention.
Figure 5B:
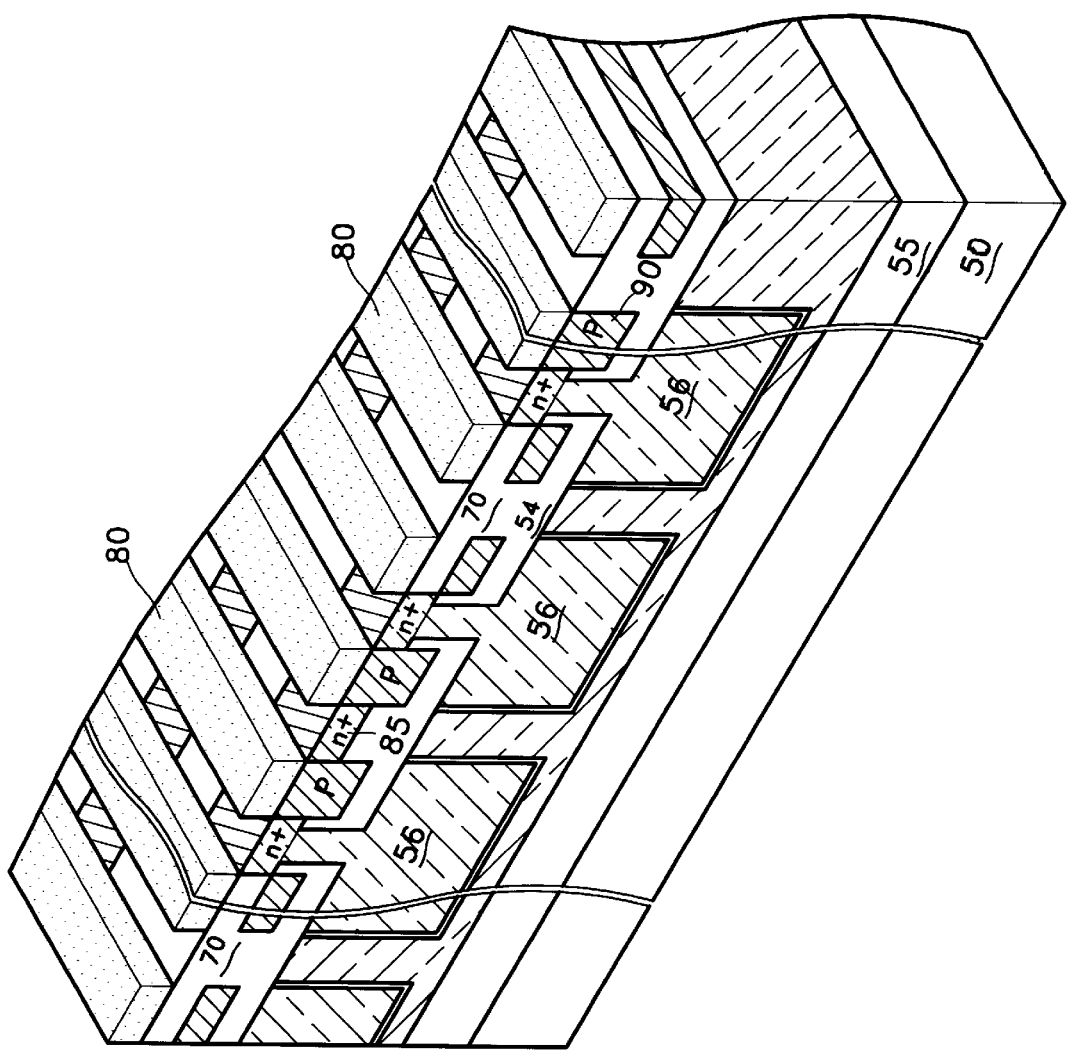

FIGS. 5A and 5B are cross-sectional views for explaining fabricating methods of SOI devices according to a second embodiment of the present invention. This embodiment is similar to the first embodiment, except that a capacitor is formed before bonding the second substrate 50.

FIG. 5A illustrates a step of forming a capacitor on the first semiconductor substrate 60 having the second trench T2 formed therein. The same steps as in the first embodiment may be performed up to the step of forming the second trench T2 shown in FIG. 4B. Then, an interlayer insulating film 54 is formed on the structure. The interlayer insulating film 54 is preferably planarized in the same manner as the insulating layer 55 of FIG. 4B according to the first embodiment.

The planarized interlayer insulating film 54 is patterned by a conventional lithography process to form a storage contact hole partially exposing the second trench T2. A conductive material, e.g., polysilicon, is deposited and patterned, thereby forming a storage electrode 56 for a capacitor. Subsequently, a dielectric material is deposited on the storage electrode 56 and patterned if necessary, thereby forming a dielectric film 58 for a capacitor defined in the storage electrode 56. A plate electrode 62 is then formed.

Next, an insulating material, e.g., oxide, is deposited to form an insulating layer 55. Thereafter, the step of bonding the second substrate 50 on the insulating layer 55 is performed in the same manner as the first embodiment.

FIG. 5B illustrates a step of completing the SOI device. The steps may be performed in the same manner as those in the first embodiment, thereby completing the SOI device having a buried capacitor formed thereunder. Although not shown, a bit line also may be formed prior to a second substrate bonding procedure to then be buried underneath the SOI film.

According to the second embodiment, since the capacitor or bit line is buried underneath the SOI film, planarization and dense integration can be achieved efficiently.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of fabricating a semiconductor-on-insulator (SOI) field effect transistor, comprising the steps of:

forming a plurality of spaced apart trenches in a first face of a semiconductor substrate;

forming an interlayer insulating film on the first face of the semiconductor substrate, including on the trenches, the interlayer insulating film including apertures therein which expose portions of the trenches;

forming storage electrodes on the interlayer insulating film, electrically contacting the trenches through the apertures;

forming a dielectric film on the storage electrodes;

forming plate electrodes on the dielectric film, opposite the storage electrodes, to thereby form a buried capacitor;

forming an insulating layer on the plate electrodes and dielectric film;

bonding a second substrate to the insulating layer formed on the plate electrodes and dielectric film, opposite the semiconductor substrate;

thinning the semiconductor substrate at a second face thereof, which is opposite the first face, until a semiconductor film remains on the insulating layer, having alternating thin and thick film semiconductor regions on the insulating layer;

forming a respective source region and drain region in respective adjacent thin film semiconductor regions; and forming an insulated gate on a thick film semiconductor region that is between the respective adjacent thin film semiconductor regions, to thereby define a field effect transistor including the respective source and drain regions in the respective adjacent thin film semiconductor regions and an insulated gate on the thick film semiconductor region therebetween.

2. A method according to claim 1 wherein the thinning step comprises the step of etching the semiconductor substrate at a second face thereof, which is opposite the first face, until a semiconductor film remains on the insulating layer, having alternating thin and thick film semiconductor regions on the insulating layer.

3. A method according to claim 1 wherein the insulating layer forming step is preceded by the step of:

forming at least one isolation trench in the first face of the semiconductor substrate, surrounding the plurality of spaced apart trenches.

4. A method according to claim 3 wherein the isolation trenches are deeper than the plurality of spaced apart trenches.

5. A method according to claim 4 wherein the thinning step comprises the step of thinning the semiconductor substrate at a second face thereof, which is opposite the first face, until the isolation trenches are exposed.

6. A method according to claim 1 wherein the following step is performed after the step of forming a respective source region and drain region:

forming an interlayer insulating film on the thin and thick film semiconductor regions, the interlayer insulating film including an electrical contact therein which electrically contacts at least the thick film semiconductor region between the respective source and drain regions.

7. A method according to claim 6 wherein the electrical contact also electrically contacts an outermost one of the thick film semiconductor regions.

* * * * *